United States Patent
LoBianco et al.

(10) Patent No.: US 6,340,846 B1
(45) Date of Patent: Jan. 22, 2002

(54) MAKING SEMICONDUCTOR PACKAGES WITH STACKED DIES AND REINFORCED WIRE BONDS

(75) Inventors: Anthony J. LoBianco, Chandler; Frank J. Juskey, Phoenix; Stephen G. Shermer, Chandler; Vincent DiCaprio, Mesa; Thomas P. Glenn, Gilbert, all of AZ (US)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/730,721

(22) Filed: Dec. 6, 2000

(51) Int. Cl.[7] .................. H01L 23/48; H01L 23/52; H01L 29/40
(52) U.S. Cl. ............... 257/783; 257/777; 257/686; 257/782; 438/109; 438/118
(58) Field of Search .................. 257/777, 782, 257/783, 723, 724, 786, 787; 438/107, 109, 110, 118, 127

(56) References Cited

U.S. PATENT DOCUMENTS

| | | | |
|---|---|---|---|
| 3,851,221 A | 11/1974 | Beaulieu et al. | 317/100 |
| 4,103,318 A | 7/1978 | Schwede | 361/388 |
| 4,361,261 A | 11/1982 | Elles et al. | 228/103 |
| 4,444,349 A | 4/1984 | Bilane et al. | 228/102 |
| 4,586,642 A | 5/1986 | Dreibelbis et al. | 228/4.5 |
| 4,730,232 A | 3/1988 | Lindberg | 361/381 |
| 4,763,188 A | 8/1988 | Johnson | 357/74 |
| 4,982,265 A | 1/1991 | Watanabe et al. | 357/75 |
| 5,025,306 A | 6/1991 | Johnson et al. | 357/75 |
| 5,040,052 A | 8/1991 | McDavid | 357/80 |
| 5,140,404 A | 8/1992 | Fogal et al. | 357/70 |
| 5,172,215 A | 12/1992 | Kobayashi et al. | 257/584 |
| 5,176,311 A | 1/1993 | Levine et al. | 228/179 |

(List continued on next page.)

FOREIGN PATENT DOCUMENTS

| | | | |
|---|---|---|---|
| JP | 61059862 A | 3/1986 | H01L/25/04 |
| JP | 61117858 A | 6/1986 | H01L/25/08 |
| JP | 62119952 A | 6/1987 | H01L/25/04 |
| JP | 62126661 A | 6/1987 | H01L/25/04 |
| JP | 62126661 | 6/1987 | H01L/25/04 |
| JP | 62142341 A | 6/1987 | H01L/25/04 |
| JP | 63128736 | 6/1988 | H01L/23/04 |
| JP | 63211663 A | 9/1988 | H01L/25/08 |
| JP | 63244654 | 10/1988 | H01L/23/28 |
| JP | 01099248 A | 4/1989 | H01L/25/08 |
| JP | 04028260 A | 1/1992 | H01L/25/065 |
| JP | 04056262 A | 2/1992 | H01L/25/065 |
| JP | 4056262 | 2/1992 | H01L/25/065 |
| JP | Hei 10-56470 | 9/1998 | H01L/25/065 |

*Primary Examiner*—Sheila V. Clark
(74) *Attorney, Agent, or Firm*—Skjerven Morrill MacPherson LLP; Don C. Lawrence

(57) ABSTRACT

This invention provides a method for making a semiconductor package with stacked dies that substantially reduces risk of fracturing of the dies and prevents breakage of the wire bonds caused by wire sweep. One embodiment of the method includes the provision of a substrate and a pair of semiconductor dies, each having opposite top and bottom surfaces and a plurality of wire bonding pads around the peripheries of their respective top surfaces. One die is attached and wire bonded to a top surface of the substrate. A measured quantity of an uncured, fluid adhesive is dispensed onto the top surface of the first die, and the adhesive is squeezed out to the edges of the dies by pressing the bottom surface of the second die down onto the adhesive until the two dies are separated by a layer of the adhesive. The adhesive is cured and the second die is wire bonded to the substrate. A bead of an adhesive is dispensed around the periphery of the dies such that it covers the wire bonds and bonding pads on the second die. A plastic body is molded over the dies and the bead of adhesive. The bead of adhesive prevents bending or breakage of the wire bonds caused by wire sweep during the subsequent molding operation.

21 Claims, 4 Drawing Sheets

U.S. PATENT DOCUMENTS

| | | | |
|---|---|---|---|
| 5,177,032 A | 1/1993 | Fogal et al. | 437/220 |
| 5,198,888 A * | 3/1993 | Sigano et al. | |
| 5,291,060 A | 3/1994 | Shimizu et al. | 257/667 |
| 5,291,061 A | 3/1994 | Ball | 257/686 |
| 5,323,060 A | 6/1994 | Fogal et al. | 257/777 |
| 5,384,689 A | 1/1995 | Shen | 361/761 |
| 5,432,729 A | 7/1995 | Carson et al. | 365/63 |
| 5,620,928 A | 4/1997 | Lee et al. | 438/118 |
| 5,682,062 A | 10/1997 | Gaul | 257/686 |
| 5,721,452 A | 2/1998 | Fogal et al. | 257/685 |
| 5,739,581 A | 4/1998 | Chillara et al. | 257/668 |
| 5,815,372 A | 9/1998 | Gallas | 361/760 |
| 5,872,025 A | 2/1999 | Cronin et al. | 438/109 |
| 5,886,412 A | 3/1999 | Fogal et al. | 257/777 |
| 5,989,982 A | 11/1999 | Yoshikazu | 438/462 |
| 6,013,948 A | 1/2000 | Akram et al. | 257/698 |
| 6,030,855 A | 2/2000 | Bertin et al. | 438/109 |
| RE36,613 E | 3/2000 | Ball | 257/777 |
| 6,033,931 A | 3/2000 | Hoffman et al. | 438/109 |
| 6,049,094 A * | 4/2000 | Penry | |
| 6,051,886 A | 4/2000 | Fogal et al. | 257/777 |
| 6,057,598 A | 5/2000 | Payne et al. | 257/723 |
| 6,087,722 A * | 7/2000 | Lee et al. | |
| 6,133,637 A * | 10/2000 | Hikita et al. | |
| 6,201,302 B1 * | 3/2001 | Tzu | |
| 6,204,091 B1 * | 3/2001 | Smith et al. | |
| 6,215,182 B1 * | 4/2001 | Ozawa et al. | |
| 6,229,217 B1 * | 5/2001 | Fukui et al. | |

* cited by examiner

MAKING SEMICONDUCTOR PACKAGES WITH STACKED DIES AND REINFORCED WIRE BONDS

RELATED APPLICATIONS

This application is related to U.S. application Ser. No. 09/620,444, filed Jul. 20, 2000.

BACKGROUND

1. Technical Field:

This invention pertains to semiconductor packaging in general, and in particular, to a method and apparatus for making semiconductor packages with tacked dies and reinforced wire bonds.

2. Related Art:

Practitioners have responded to an increasing demand for semiconductor packages that are smaller, yet more functional, by stacking two or more semiconductor dies, or "chips," in one package. FIGS. 1 and 2 show a prior art ball grid array ("BGA") semiconductor package 10 having a pair of stacked dies 14 and 16. First die 14 is attached to the top surface of an insulative substrate 12 with an adhesive 13. Second die 16 is stacked on the top surface of first die 14, and is attached thereto by an adhesive layer 15. Both dies 14 and 16 have peripheral bond pads 34 that are electrically connected by conductive wires 38 to respective pads 26 in a metal layer 22 on the top surface of substrate 12. Adhesive layer 15 is positioned entirely within the perimeter of die bond pads 34, and provides clearance for the wires 38 that are connected to first die 14. The pads 26 in metal layer 22 are electrically connected to traces of a metal layer 24 on the bottom surface of substrate 12 by metallized vias 23 through substrate 12. Solder balls 25 are fused to lands 27 formed in metal layer 24. A molded plastic body 60 (shown by dotted outline in FIG. 2) encapsulates dies 14, 16, wires 38, and the top surface of substrate 12.

While this package has enhanced component density, it also has certain drawbacks. For example, during wire bonding, second die 16 may crack due to downward force applied by a wire bond head 62 to the cantilevered peripheral portion of die 16. In addition, a wedge of the molding compound may penetrate the space 19 between stacked dies 14, 16. Since the mold compound typically has a different coefficient of thermal expansion than adhesive layer 15, the two dies may crack apart. Another problem is "wire sweep," i.e., the tendency of the relatively long bond wires 38 of second die 16 to be bent or broken by the rush of molten plastic during molding. Accordingly, there is a need for an improved package design and manufacturing method.

BRIEF SUMMARY

This invention provides a simple, inexpensive method for making a semiconductor package with stacked dies that eliminates fracturing of the dies during the wire bonding process or as a result of incompatible thermal expansions, and that also eliminates the problem of broken wire bonds as a result of wire sweep. The method permits the use of ultra-thin dies having either the same or different sizes.

In one embodiment, the method includes the provision of a substrate, which may be either a conventional laminate or a lead-frame-type of substrate, and a pair of semiconductor dies. Each die has opposite top and bottom surfaces and a plurality of wire bonding pads located around the periphery of the top surface thereof. The bottom surface of the first die is attached to a top surface of the substrate, and the wire bonding pads on the first die are connected to wire bonding areas on the top surface of the substrate with a first plurality of conductive wires.

A measured quantity of an uncured, electrically non-conductive, viscous fluid adhesive is dispensed onto the top surface of the first die. The bottom surface of the second die is then pressed down onto the adhesive to squeeze, or distribute, it laterally between the two dies and toward their respective peripheries until: 1) the bottom surface of the second die is spaced apart from the top surface of the first die by a layer of the adhesive thick enough to prevent shorting contact between the second die and the conductive wires bonded to the top surface of the first die; 2) the entire bottom surface of the second die, including any portion overhanging the first die and the substrate, is supported from below by the layer of adhesive; and, 3) the wire bonding pads on the top surface of the first die and the inner ends of the conductive wires bonded thereto are encapsulated by the adhesive. The adhesive layer is then cured, and the wire bonding pads on the top surface of the second die are wire bonded to wire bonding areas on the top surface of the substrate with a second plurality of conductive wires.

After the second die is wire bonded to the substrate, a bead of adhesive is dispensed around the entire periphery of the stack of dies such that the exposed portions of the wires connecting both dies to the substrate are completely encapsulated within the bead of adhesive, which is then cured to harden it. The bead of adhesive can be the same material as the layer of die attach adhesive applied between the dies, or a material with the same or a very similar coefficient of thermal expansion. The bead of adhesive contacts and adheres to the entire perimeter of the layer of hardened die attach adhesive.

The hardened layer of adhesive below the entire bottom surface of the second die supports the die from below and prevents the second die from being fractured by forces acting thereon during wire bonding. In addition, because the adhesive layer fills the peripheral space between the opposing surfaces of the two dies, the layer prevents the molding compound or other encapsulant formed over the stacked dies from flowing into the space and forming a potentially destructive "thermal wedge" between the dies. Further, since the adhesive layer also covers the wire bonding pads on the top surface of the first die, as well as the inner ends of the conductive wires that are bonded thereto, it helps maintain the integrity of the electrical connection between the wires and the first die during the subsequent handling and manufacturing processes. The hardened bead of adhesive around the periphery of the dies encloses the portions of the conductive wires not encapsulated by the die attach adhesive layer, including the ends of the wires bonded to the pads on the second die, and the middle portions and outer ends of the of the wires attached to both dies, thereby reinforcing the wires and preventing bending or breakage caused by wire sweep during package encapsulation.

A better understanding of the above and other features and advantages of the invention may be had from a consideration of the detailed description below of some exemplary embodiments thereof, particularly if such consideration is made in conjunction with the appended drawings.

DETAILED DESCRIPTION

Figure 1:
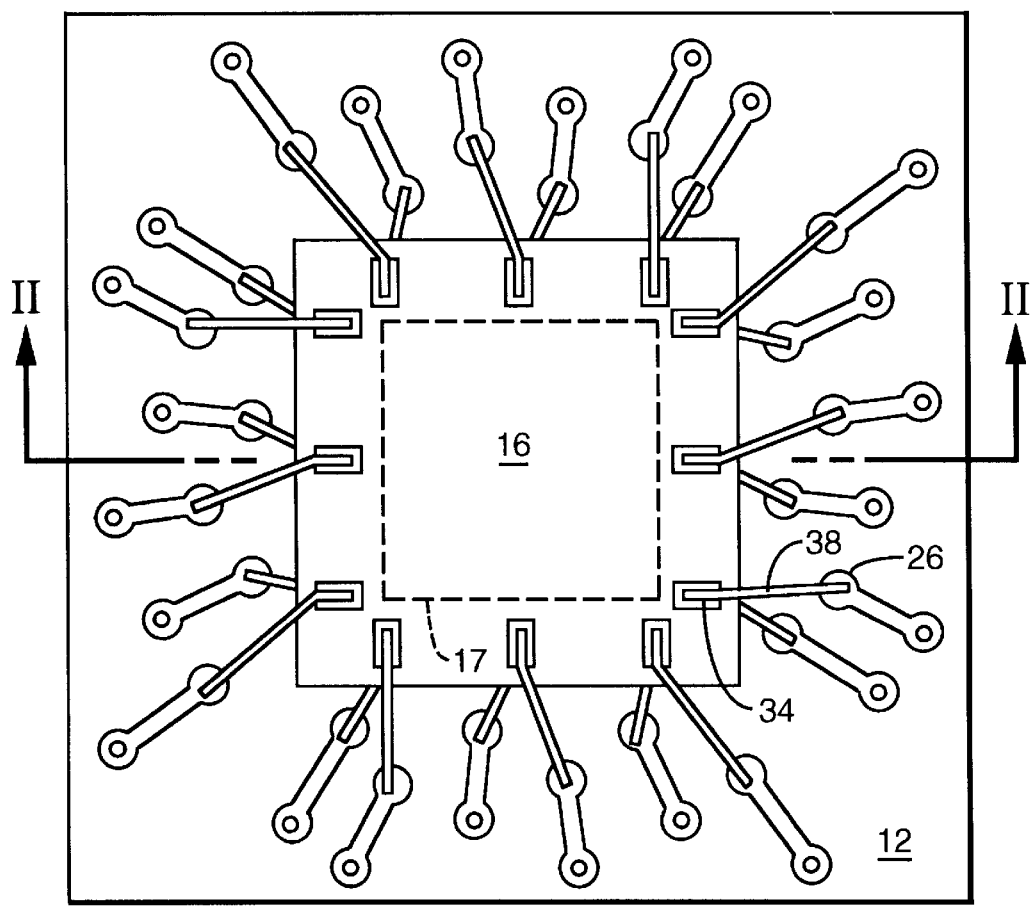
FIG. 1 is a top plan view of a semiconductor package with stacked dies made in accordance with the prior art.
Figure 2:
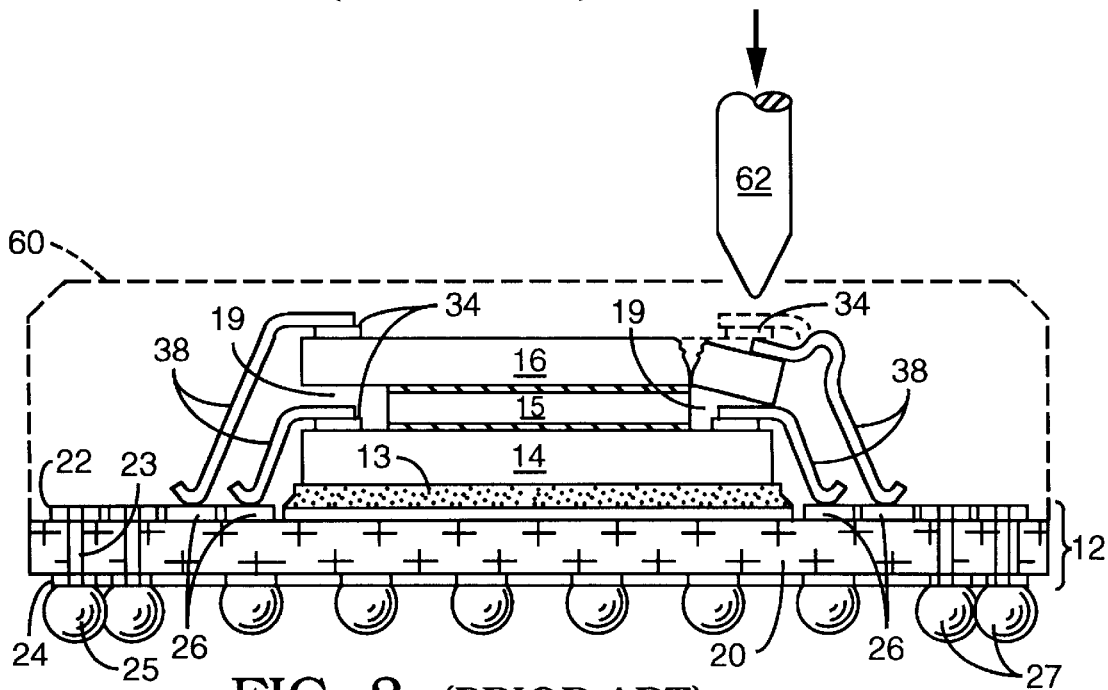
FIG. 2 is a cross-sectional side elevation view into the prior art package illustrated in FIG. 1, as revealed by the section taken along the lines II—II therein.
Figure 3:
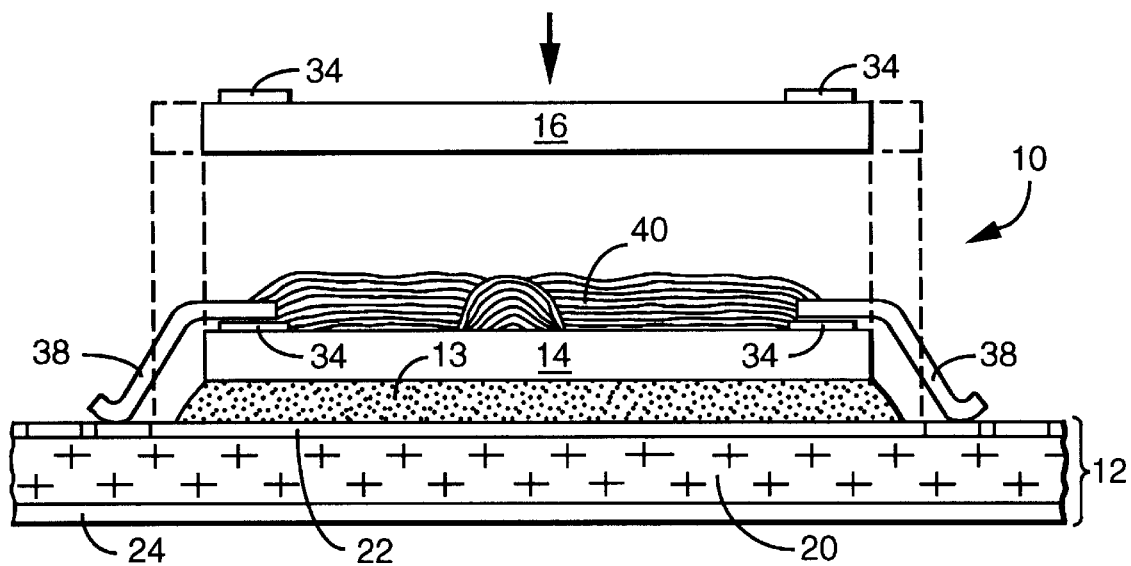
FIG. 3 is a cross sectional side elevation view into a semiconductor package with stacked dies made in accordance with a first exemplary embodiment of the present invention, before a second, top die is mounted on the top surface of a first, bottom die.

A first exemplary embodiment of a semiconductor package 10 with stacked dies 14 and 16 made in accordance with one of the methods of the present invention is illustrated in the expanded cross-sectional view of FIG. 3, in which elements similar to those of the prior art stacked-die package 10 illustrated in FIGS. 1 and 2 are labeled with similar reference numerals.

The first embodiment of the package 10 shown includes a conventional laminate-type substrate 12 comprising an insulative layer 20 sandwiched between top and bottom layers 22, 24 of a metal, e.g., copper or aluminum. Alternatively, substrate 12 may be formed of polyimide or some other insulative material. For simplicity, the metallized vias through substrate 12 between metal layers 22, 24 are not shown. It should be understood that, in any of the embodiments described herein, a lead-frame-type of substrate can be substituted for the laminate-type substrate illustrated.

A first semiconductor die 14 is provided which has opposite top and bottom surfaces and a plurality of wire bonding pads 34 located around the periphery of the top surface thereof. The bottom surface of the first die 14 is attached to a top surface of the substrate 12 with, e.g., an adhesive tape or a layer of an adhesive 13, in a conventional manner, which may be effected with automated die-attach appaatus of a type known in the industry.

After the first die 14 is attached to the substrate 12, the wire bonding pads 34 on the top surface of the first die 14 are connected to wire bonding areas 26 on the top surface of the substrate with a first plurality of conductive wires 38 in a conventional manner, which may also be effected with automated wire bonding equipment of a known type.

As illustrated in FIG. 3, after the first die 14 has been attached and wire bonded to the substrate 12, a measured quantity of an uncured, fluid adhesive 40 is dispensed onto the top surface of the first die 14 at about the center thereof. Advantageously, the adhesive 40 may be dispensed onto the first die 14 in a "starburst" pattern 41 (shown by phantom outline in FIG. 4) having radial lines extending out from the center of the die 14 to achieve a uniform rectangular spread, or dispersal, of the adhesive in the manner described below.

The adhesive 40 can comprise a wide variety of known types of die-attach adhesives, e.g., Hysol 4323, 4451, or 4450, available from Dexter, Inc., City of Industry, California. It is desirable that the adhesive 40 have a relatively high, pastelike viscosity, e.g., about $1-2\times10^6$ centipoise, so that the adhesive will remain in place on the surface of the die 14 after dispensing, and not run off of it quickly, as would a thin, liquid adhesive.

A second semiconductor die 16 is provided having opposite top and bottom surfaces, and a plurality of wire bonding pads 34 located around the periphery of the top surface thereof. In the embodiment illustrated with solid lines, the length and width of the second die 16 are respectively equal to the length and width of the first die 14, as would be the case where the two dies are identical, e.g., in a memory application where dies 14, 16 are identical memory die.

Figure 4:
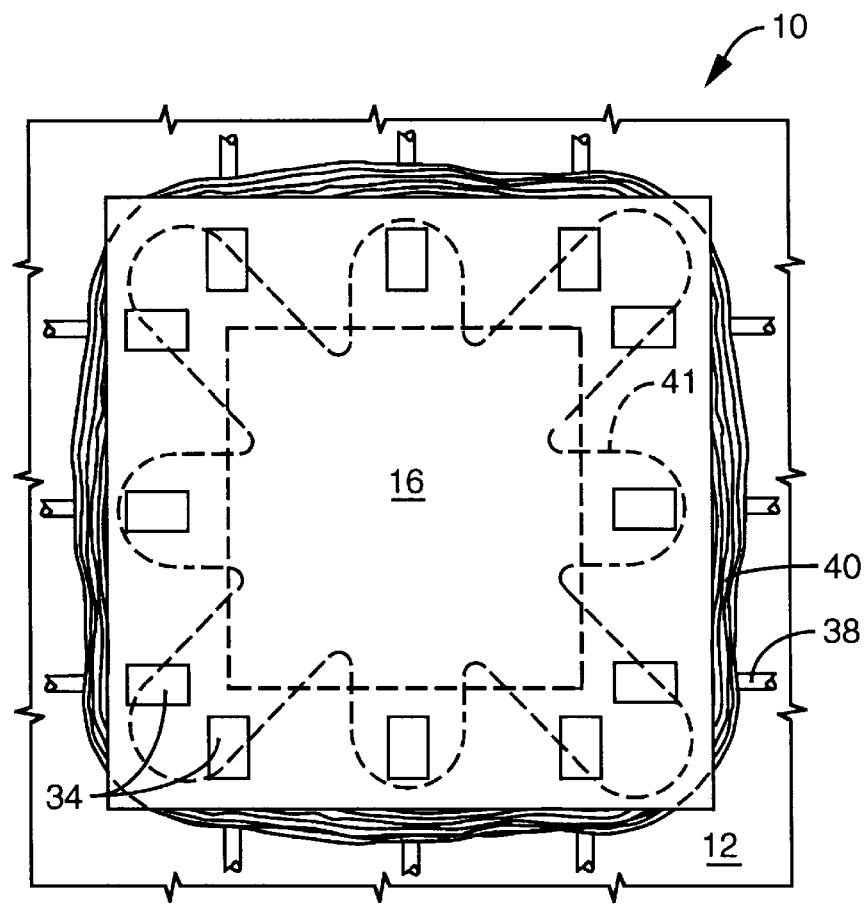
FIG. 4 is a top plan view of a portion of the package illustrated in FIG. 3 after attachment of the second die to the first die and before the second die is wire bonded to the substrate.

As shown in FIG. 3, second die 16 is attached to the top surface of the first die 14 by pressing the bottom surface of the second die down onto the adhesive 40 in the direction of the arrow shown therein, which has the effect of squeezing, or distributing, the adhesive radially outward from the center of the two opposing die surfaces in a generally rectangular pattern, as shown in FIG. 4.

The second die 16 is pressed down onto the adhesive 40 until a desired bond line, or adhesive layer 42, thickness and uniform lateral dispersal of the adhesive are obtained. In particular: 1) the resulting bond line thickness is such that the bottom surface of the second die is spaced apart from the top surface of the first die 14 by a layer 42 of the adhesive 40 thick enough to prevent the bottom surface of the second die from contacting any of the first plurality of conductive wires 38 extending over the top surface of the first die 14; and, 2) the radial extent of the layer 42 of adhesive 40 is such that it covers all, or at least substantially all, of the top surface of the first die 14 and the bottom surface of the second die 16, including the bonding pads 34 on the top surface of the first die 14 and the inner ends of the first plurality of conductive wires 38 bonded thereto.

As a result of the above distribution of the adhesive 40, the second die 16 is fully supported from below over its entire area, including the peripheral area of the wire bonding pads 34 on the top surface of second die 16. Also, because the adhesive 40 fills the peripheral space 19 between the overhanging top die 16 and the lower die 14 and/or substrate 12, the layer 42 of adhesive 40 prevents the molding compound subsequently molded over the stacked dies 14, 16 from flowing into the peripheral space and forming a potentially destructive "thermal wedge" between the dies or between the upper die(s) and the substrate. In addition, the adhesive 40 encloses the wire bonding pads 34 on the top surface of the first die 14, as well as the inner ends of the conductive wires 38 bonded thereto, and thereby helps to maintain the integrity of the electrical connection between the wires and the pads during the subsequent molding or other encapsulation process, during which the connections may be subject to substantial pulling forces due to wire sweep.

The desired bond line 42 thickness and lateral dispersal of the adhesive described above are achieved by carefully controlling: 1) the quantity of adhesive 40 dispensed onto the top surface of the first die 14; and, 2) the distance that the second die 16 is pressed down onto the adhesive. Control of both parameters can be effected with conventional automated adhesive-dispensing and die-attachment apparatus currently available in the packaging industry, although the die-attach apparatus must be capable of fairly precise vertical, or "Z-axis," control of the die chuck, which is typically effected with closed-loop, positional-feedback-controlled equipment. A commercially available die-attach machine capable of achieving the requisite degree of Z-axis control is, e.g., the MRSI-375 die-attacher available from MRSI of Chelmsford, Mass., or its equivalent.

Figure 5:
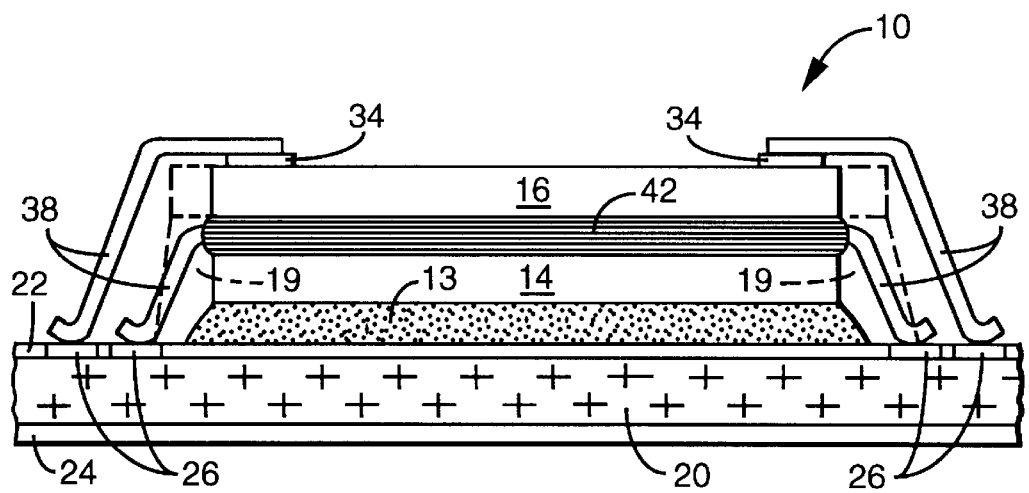
FIG. 5 is a cross sectional side elevation view into the package illustrated in FIG. 3 after the second die has been mounted on the top surface of the first die and wire bonded to the substrate.

When the adhesive 40 has been distributed between the two opposing surfaces of the dies 14 and 16 and/or substrate 12 as above, the adhesive 40 is cured to solidify it, which, depending on the type of adhesive employed, may be effected by, e.g., heating the adhesive, as in a conveyor oven, or by irradiating it with ultraviolet ("U.V.") light, in the case of a U.V.-cured epoxy resin. When the adhesive 40 is cured, the wire bonding pads 34 on the top surface of the second die 16 may be safely wire bonded to the wire bonding areas 26 on the top surface of the substrate 12 with a second plurality of conductive wires 38 (see FIG. 5) without fracturing the second die, because the cured layer 42 of adhesive 40 supports the peripheral portions of the second die against the bending and shear forces associated with the wire bonding operation discussed above in connection with FIG. 2 After the second die 16 has been mounted and wire bonded to the substrate 12, but before the encapsulating plastic body 60 (shown by the dashed lines in FIG. 6) is molded onto the package 10, a bead 64 of a relatively viscous adhesive is dispensed, as with a nozzle 66 of an automated pressure dispenser, around the entire periphery of the stacked dies such that bead slowly flows downward and laterally to cover the wire bonding pads 34 on the top surface of the second die 16, the ends of the conductive wires 38 bonded thereto, the central portions of the wires bonded to both dies 14 and 16, and the ends of the wires bonded to the bonding pads 26 on the substrate 12. The adhesive bead 64 can be applied so as to contact and adhere to the entire perimeter of layer 42 between dies 14, 16, so that there are no gaps through which molding compound can enter any space between the dies. In other words, an integral, protective body is formed by layer 42 and bead 64. In this embodiment, a central portion of the top surface of second die 16 is not covered by bead 64, although such coverage is possible in an alternative embodiment.

Figure 6:
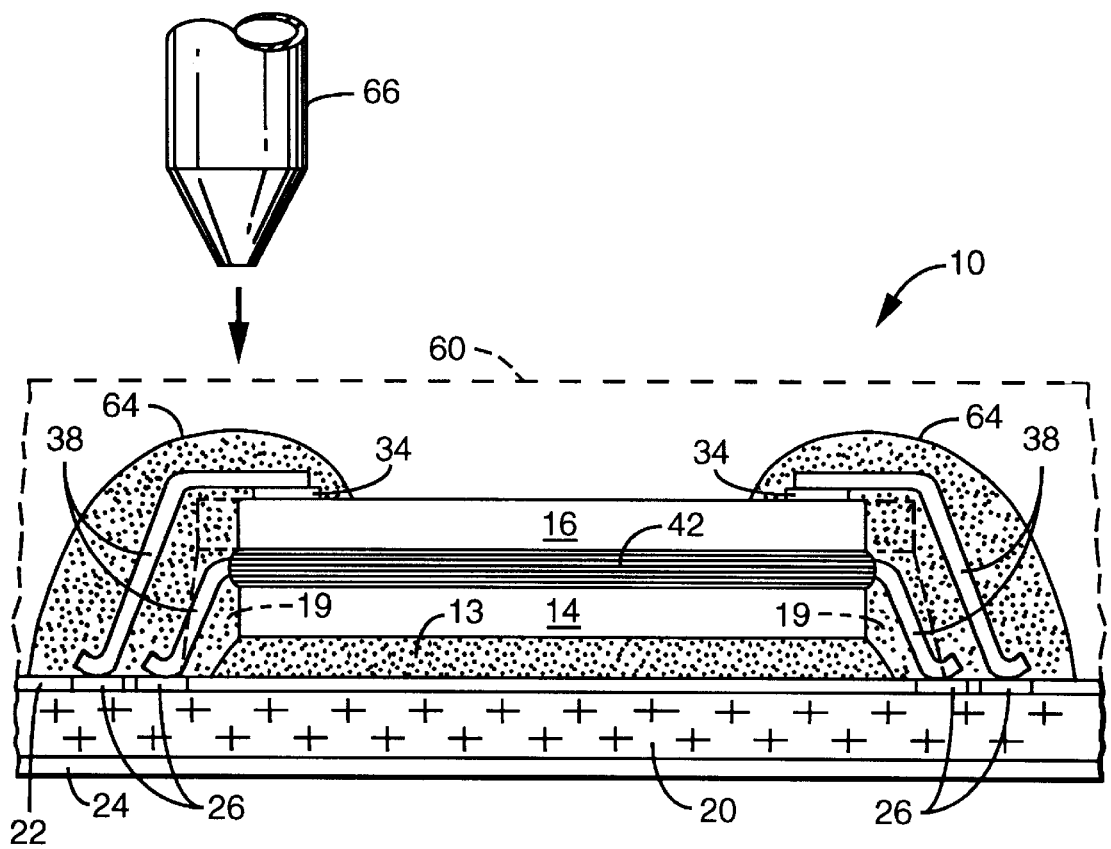
FIG. 6 is a cross sectional side elevation view into the package illustrated in FIG. 5 after a protective bead of an adhesive has been dispensed around the periphery of the dies to encapsulate the conductive wires and bonding pads at either end.

In one advantageous embodiment, the adhesive of bead 64 is the same adhesive material used to form the layer 42 between the two dies 14 and 16, e.g., Hysol 4323, 4450, or 4451, or a mixture of one or more of the foregoing, and may be dispensed as described and shown in FIG. 6 using the same automatic dispensing equipment 66 used to dispense the former on the top surface of the first die 14. In another embodiment, adhesive material 40 of layer 42 and the bead of adhesive 64 are different materials, but have the property of adhering to each other, and have the same, or very similar, coefficients of thermal expansion.

After the bead 64 of adhesive has flowed over and enclosed the pads 24 on the second die 16 and the exposed portions of the conductive wires 38 as shown in FIG. 6, it is cured to harden it. As above, the bead 64 of adhesive may be cured by, e.g., heating the adhesive, as in a conveyor oven, or by irradiating it with ultraviolet ("U.V.") light. The rigid structure thus formed over the conductive wires 38 functions to reinforce the wires and their respective attachments to the substrate 12 and the second die 16 in the same manner as the adhesive layer 42 reinforces the wire bonding pads 34 on the top surface of the first die 14 and the inner ends of the respective conductive wires 38 that are bonded thereto. The hardened bead 64 of adhesive and the adhesive layer 42 thus cooperate with each other to prevent wire sweep during the subsequent molding of the plastic body 60, thereby preventing breakage of the wires 38 by wire sweep during the molding operation used to form the plastic body 60 on the package 10.

Where the die-attach equipment lacks the precision of Z-axis control described above, it may be desirable to include an alternate mechanism for precisely controlling the final thickness of the adhesive layer 42 between the opposing surfaces of the two dies 14 and 16. As shown in the second exemplary embodiment of semiconductor package 10 illustrated in FIG. 7, this can be achieved in a simple, inexpensive manner by filling the uncured, fluid adhesive 40 with a quantity of microspheres 48, each having a diameter approximately equal to the desired final thickness of the layer 42 of adhesive 40.

Figure 7:
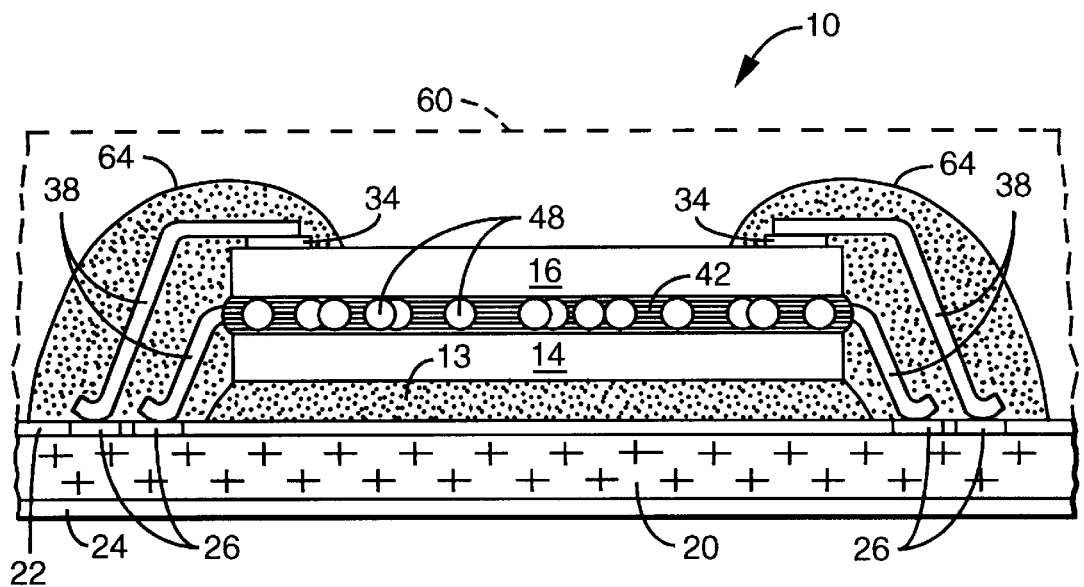
FIG. 7 is a cross sectional side elevation view similar to FIG. 6 and looking into a semiconductor package with stacked dies made in accordance with a second exemplary embodiment of the present invention; and, FIG. 8 is a cross sectional side elevation view similar to FIGS. 6 and 7 and looking into a semiconductor package with stacked dies made in accordance with a third exemplary embodiment of the present invention

As illustrated in FIG. 7, the second die 16 is then simply pressed down onto the filled adhesive 40 until the bottom surface of the second die "bottoms out" on the microspheres 48, i.e., is spaced apart from the top surface of the first die 14 by a single layer of the uniformly sized microspheres. As in the first embodiment, it is desirable that the cured layer 42 of the filled adhesive 40 extend into any peripheral space between the bottom surface of the top second die 16 and the bottom first die so that: 1) the peripheral portion of the second die is fully supported from below, and 2) the radial extent of the layer 42 of adhesive 40 is such that it covers all, or at least substantially all, of the top surface of the first die 14 and the bottom surface of the second die 16, including the bonding pads 34 on the top surface of the first die 14 and the inner ends of the first plurality of conductive wires 38 bonded thereto.

In one possible embodiment, the material of the microspheres 48 can be selected such that they maintain their generally spherical nature regardless of the curing processes applied to the adhesive 40 matrix in which they are incorporated, e.g., glass, silicon dioxide, silicon nitride, or polytetraflouroethylene (Teflon) microspheres. Other materials can be selected that cause the microspheres to become integrally "homogenized" into the fluid adhesive 40 matrix when the latter cures, e.g., a thermoplastic polymer that melts at the same temperature at which a thermocuring adhesive is cured.

Figure 8:
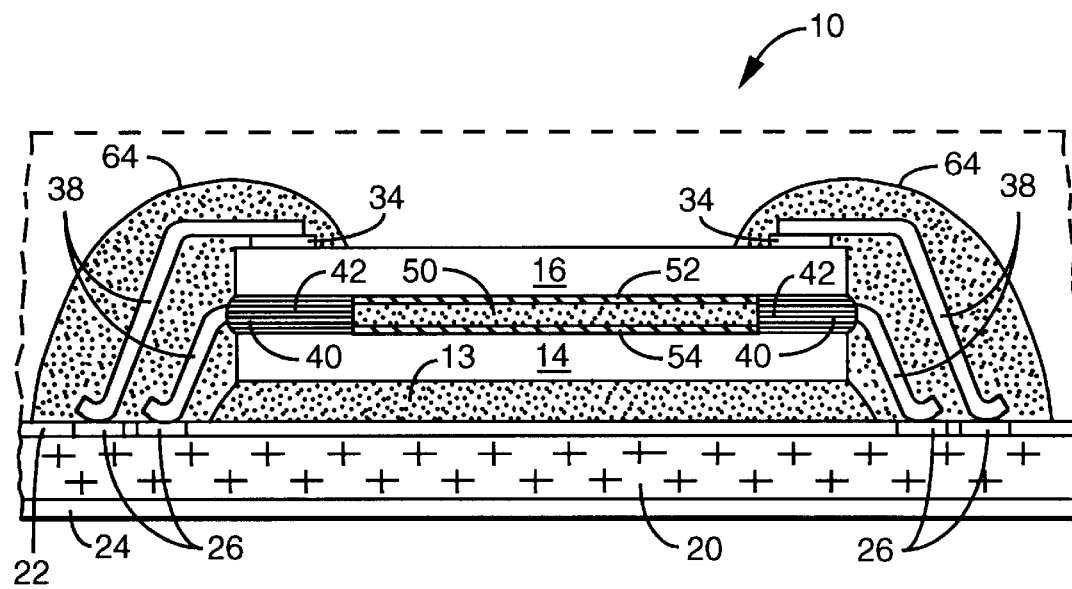

An effective alternative to the filled-adhesive method of the second exemplary embodiment described above is provided by the third exemplary embodiment of the method and package 10 of the present invention illustrated in FIG. 8. The third embodiment comprises interposing a spacer 50 between the top surface of the first die 14 and the bottom surface of the second die 16. The spacer 50 has opposite top and bottom surfaces, each with a respective layer 52 and 54 of an adhesive thereon, an overall thickness equal to the desired final thickness of the layer 42 of adhesive 40 between the first and second dies 14 and 16, and a perimeter 17 (shown as a dotted outline in FIG. 4) positioned inside of the wire bonding pads 34 on the top surface of the first die 14.

As illustrated in FIG. 8, the first die 14 is conventionally attached and wire bonded to the substrate 12, as in the first and second embodiments above. The spacer 50 is then attached to the top surface of the first die 14 with the layer of adhesive 54, such that the perimeter 17 of the spacer is positioned inside of the wire bonding pads 34 on the top surface of the first die. A bead of uncured, fluid adhesive 40 is then dispensed onto the top surface of the first die 14 outside of and completely around the entire perimeter 17 of the spacer 50, and the second die 16 is pressed down onto the first die until its bottom surface contacts the layer 52 of adhesive on the top surface of the spacer 50.

The pressure of the second die 16 on the fluid adhesive 40 forces the adhesive outward from the spacer 50 and toward the edges of the two dies, and the second die is pressed down until its bottom surface is spaced apart from the top surface of the first die 14 by a layer 42 having the same thickness as the spacer. The adhesive 40 covers the wire bonding pads 34 on the top surface of the first die 14 and the connections of the first plurality of bonding wires to those pads, and fills the peripheral space between the two dies. The adhesive 40 thus covers the entire area of the respective top and bottom surfaces of the first and second dies 14 and 16 that are not already covered by the spacer 50, thereby excluding the encapsulant of the package body 60 from any peripheral space between the stacked dies, or between an overhanging second die 16 and the substrate 12.

The spacer 50 can be made from a variety of materials, including a fiberglass matrix impregnated with a tacky, uncured (i.e., "B-stage") epoxy resin, or a ceramic, e.g., silicon or an oxide thereof, or alternatively, a plastic polymer sheet cut to the appropriate size. The adhesive layers 52 and 54 can be applied to the spacer 50 before it is attached to the first die 14, or alternatively, can be applied sequentially at the time the spacer is mounted to the die, first to the top surface of the first die 14, then to the top surface of the spacer before the second die is mounted on top of it. In yet another variation, the adhesive layer 52 used to mount the second die 16 on the spacer 50 can comprise the same adhesive material as the uncured, fluid adhesive 40 dispensed around the perimeter 17 of the spacer 50, and can be deposited simultaneously therewith. In all cases, the layers of adhesive 52 and 54 on the spacer 50, and the layer 42 of adhesive 40 may all be simultaneously cured in a single step.

Referring again to FIG. 3, an alternative embodiment of the package 10 has a second die 16 that overhangs all or part of the perimeter of first die 14. Such a die 16 is shown by the dashed lines in FIG. 3. Such a package may made using the same processes as described above in conjunction with FIGS. 3–8. Because there is an overhang area 19, there is some risk of fracture of die 16, albeit less of a risk that with the prior art embodiment of FIGS. 1 and 2, since more of the bottom area of die 16 is supported by adhesive layer 42 than was supported by the prior art adhesive layer 15 of FIG. 2. To avoid any such risk, an additional small bead of a limited viscosity adhesive material may be provided under and around the periphery of die 16 in overhang area 19 prior to wire bonding second die 16 and prior to applying adhesive bead 64. The small bead may be cured simultaneously with adhesive layer 40 between dies 14, 16. The small bead must not, of course, interfere with the wire bonding of second die 16. Ideally, the same material would be used for that small bead as for adhesive layer 40 and bead 64 of FIG. 5.

It should be understood that many modifications, variations, and substitutions can be made in terms of the materials and methods of the present invention without departing from its scope and spirit. For example, it is possible to construct "hybrid" embodiment that combines elements of the first, second, and/or third embodiments by, e.g., dispensing a first quantity of an adhesive 40 filled with microspheres 48 in the central portion of the top surface of the first die 14, as in the second embodiment, then dispensing a bead of an unfilled adhesive 40 around the first quantity of filled adhesive thereon, as in the third embodiment. As another example, a third die could be stacked on second die 16 using the same techniques used to stack second die 16 on first die 14. After the third die was stacked, then the bead of adhesive 64 would be applied over the peripheral bond pads of the third die and over wires 38.

Similarly, those of skill in the art will recognize that the methods of the invention described herein lend themselves readily to volume production methods in which a number of packages 10 are fabricated simultaneously in the form of a connected strip or array of identical packages that is subsequently cut apart, or "singulated," into individual packages.

In view of the foregoing, the scope of the present invention should not be limited to that of the particular embodiments described and illustrated herein, as these are merely exemplary in nature. Rather, the scope of this invention should be measured by that of the claims appended below, and their equivalents.

What is claimed is:

1. A method for making a semiconductor package with stacked dies, the method comprising:

providing a substrate having a first semiconductor die mounted thereon;

stacking a second semiconductor die on top of the first die;

electrically connecting conductive wires between wire bonding pads on respective top surfaces of the first die, the second die, and the substrate;

attaching a bottom surface of the second die to the top surface of the first die with a first layer of an adhesive such that the bottom surface of the second die is supported above the conductive wires connected to the wire bonding pads on the first die without contacting the wires, and such that the adhesive covers the wire bonding pads on the first die;

dispensing a bead of an adhesive around the periphery of the first and second dies and onto the substrate such that the bead of adhesive covers the bonding pads on the top surface of the second die, ends of the conductive wires connected thereto, and the entire length of the conductive wires extending between the periphery of the dies and the substrate;

curing the first layer and bead of adhesive to harden them; and, molding a monolithic body of an encapsulant over the first and second dies and the bead of adhesive.

2. The method of claim 1, wherein microspheres are incorporated into the first layer of adhesive, and further comprising pressing the bottom surface of the second die down onto the first layer of adhesive until the bottom surface of the second die is spaced above the top surface of the first die by a single layer of the microspheres.

3. The method of claim 1, further comprising interposing a spacer between the top surface of the first die and the bottom surface of the second die, the spacer having second and third layers of an adhesive on respective opposite surfaces thereof and a perimeter located inside of the wire bonding pads on the top surface of the first die, and wherein the first layer of adhesive surrounds the spacer and substantially occupies a peripheral space around the spacer and between the opposing surfaces of the two dies.

4. The method of claim 3, further comprising curing the second and third layers of adhesive, and wherein at least two of the first, second, and third layers of adhesive are cured simultaneously.

5. The method of claim 1, wherein the hardened first layer of adhesive prevents the encapsulant from penetrating into a peripheral space defined between the top surface of the first die and the bottom surface of the second die.

6. The method of claim 1, wherein the bead of adhesive is applied so that the bead contacts an entire perimeter of the first layer.

7. The method of claim 1, wherein the adhesive material of the first layer of adhesive is a same as that of the bead of adhesive.

8. The method of claim 1, wherein a peripheral portion of the second die overhangs a perimeter of the first die.

9. The method of claim 1, wherein the first layer of adhesive comprises a first portion filled with microspheres and a second portion free of microspheres surrounding the first portion, and further comprising:

pressing the bottom surface of the second die down onto the first layer of adhesive until the bottom surface of the second die is spaced above the top surface of the first die by a single layer of the microspheres and the second portion of the first layer of adhesive occupies the peripheral space around the first portion of the first layer of adhesive and between the opposing surfaces of the two dies.

10. The method of claim 1, wherein the package comprises one of a plurality of identical packages connected together in the form of a strip or an array thereof, and further comprising singulating the package from the strip or array.

11. A semiconductor package with stacked dies, the package comprising:

a substrate having first and second semiconductor dies stacked on top thereof, each die having opposite top and bottom surfaces and a plurality of wire bonding pads around the periphery of the top surface thereof;

a plurality of conductive wires electrically connected between the wire bonding pads on the first and second dies and the substrate;

a first layer of a hardened adhesive attaching the bottom surface of the second die to the top surface of the first die such that the bottom surface of the second die is superposed above the conductive wires connected to the first die without contacting the wires, and such that the first layer covers the wire bonding pads of the first die and ends of the wires connected thereto;

a hardened bead of an adhesive extending around the periphery of the first and second dies and covering the bonding pads on the top surface of the second die, ends of the conductive wires connected thereto, and the entire length of the conductive wires extending from the periphery of the dies to the substrate; and, a monolithic body of an encapsulant molded over the first and second dies and the bead of adhesive.

12. The semiconductor package of claim 11, wherein the first layer of adhesive is filled with microspheres, and wherein the bottom surface of the second die is spaced above the top surface of the first die by a single layer of the microspheres.

13. The semiconductor package of claim 11, further comprising a spacer interposed between the top surface of the first die and the bottom surface of the second die, the spacer having opposite surfaces, second and third layers of an adhesive on respective ones of the opposite surfaces, and a perimeter located inside of the wire bonding pads on the top surface of the first die, and wherein the first layer of adhesive surrounds the spacer and occupies a peripheral space around the perimeter of the spacer and between the opposing surfaces of the two dies.

14. The semiconductor package of claim 13, wherein the spacer comprises a polyimide resin, a B-stage composite, a ceramic, or silicon.

15. The semiconductor package of claim 11, wherein the first layer and the bead of adhesive are a same material.

16. The semiconductor package of claim 15, wherein the bead of adhesive contacts the first layer of adhesive around the entire perimeter thereof.

17. The semiconductor package of claim 11, wherein a peripheral portion of the second die overhangs a peripheral portion of the first die.

18. The semiconductor package of claim 11, wherein the first layer of adhesive comprises a first portion filled with microspheres and a second portion free of microspheres surrounding the first portion, the bottom surface of the second die being spaced apart from the top surface of the first die by a single layer of the microspheres, and the second portion of the first layer of adhesive occupying a peripheral space around the first portion of the first layer of adhesive and between the opposing surfaces of the two dies.

19. The semiconductor package of claim 11, wherein at least one side of the second die overhangs a corresponding side of the first die and defines a peripheral space between the second die and the substrate adjacent to the first die; and wherein, a hardened third adhesive substantially fills the peripheral space between the second die and the substrate, said third adhesive being of the same material as one or both of the first layer and the bead of adhesive.

20. The semiconductor package of claim 11, wherein the first layer and bead of adhesive have about the same thermal coefficient of expansion.

21. The semiconductor package of claim 11, wherein the substrate is selected from the group consisting of a lead frame with a die paddle, an insulative laminate sheet, and a polyimide sheet.

* * * * *

UNITED STATES PATENT AND TRADEMARK OFFICE
CERTIFICATE OF CORRECTION

PATENT NO.    : 6,340,846 B1
DATED         : January 22, 2002
INVENTOR(S)   : Anthony J. LoBianco et al.

It is certified that error appears in the above-identified patent and that said Letters Patent is hereby corrected as shown below:

<u>Column 1,</u>
Line 14, delete "tacked" and insert -- stacked --; and

<u>Column 3,</u>
Line 55, delete "appaatus" and insert -- apparatus --.

Signed and Sealed this

Fifteenth Day of April, 2003

JAMES E. ROGAN
*Director of the United States Patent and Trademark Office*